US010794763B2

(12) United States Patent
Meloni et al.

(10) Patent No.: US 10,794,763 B2
(45) Date of Patent: Oct. 6, 2020

(54) FIBEROPTICALLY-COUPLED MEASUREMENT SYSTEM WITH REDUCED SENSITIVITY TO ANGULARLY-DRIVEN VARIATION OF SIGNALS UPON REFLECTION FROM A WAFER

(71) Applicant: Verity Instruments, Inc., Carrollton, TX (US)

(72) Inventors: Mark A. Meloni, Carrollton, TX (US); John D. Corless, Carrollton, TX (US)

(73) Assignee: Verity Instruments, Inc., Carrollton, TX (US)

( * ) Notice: Subject to any disclaimer, the term of this patent is extended or adjusted under 35 U.S.C. 154(b) by 0 days.

(21) Appl. No.: 16/788,024

(22) Filed: Feb. 11, 2020

(65) Prior Publication Data

US 2020/0264044 A1    Aug. 20, 2020

Related U.S. Application Data

(60) Provisional application No. 62/807,992, filed on Feb. 20, 2019.

(51) Int. Cl.
*G01J 3/00*    (2006.01)
*G01J 3/02*    (2006.01)
*H01L 21/66*    (2006.01)

(52) U.S. Cl.
CPC .............. *G01J 3/0218* (2013.01); *G01J 3/021* (2013.01); *G01J 3/0208* (2013.01); *H01L 22/12* (2013.01)

(58) Field of Classification Search
CPC ........ G01J 3/0218; G01J 3/0208; G01J 3/021; G01J 3/02; G01J 3/00; H01L 22/12
See application file for complete search history.

(56) References Cited

U.S. PATENT DOCUMENTS

2015/0055137 A1*  2/2015  Brown .............. G01B 9/02091
                                                356/479

\* cited by examiner

*Primary Examiner* — Abdullah Nur

(57) ABSTRACT

An optical system having an OAP mirror collimator is disclosed with a housing, an OAP mirror located within the housing and has an optical axis, a fold plane and a focal point. A fiber optical cable is coupled to the housing and has first and second optical fibers, each having an exit end that form a common end face of the fiber optic cable, wherein the fiber optical cable is rotationally and translationally aligned to the OAP mirror such that the common face is perpendicular to and centered upon the optical axis of the OAP mirror and positioned a fixed distance from the focal point, and wherein the optical axes of the first and second optical fibers are jointly angularly aligned to the fold plane, and the optical axes of the first and second optical fibers deviate from being parallel to the optical axis by no more than 0.15 degrees.

20 Claims, 9 Drawing Sheets

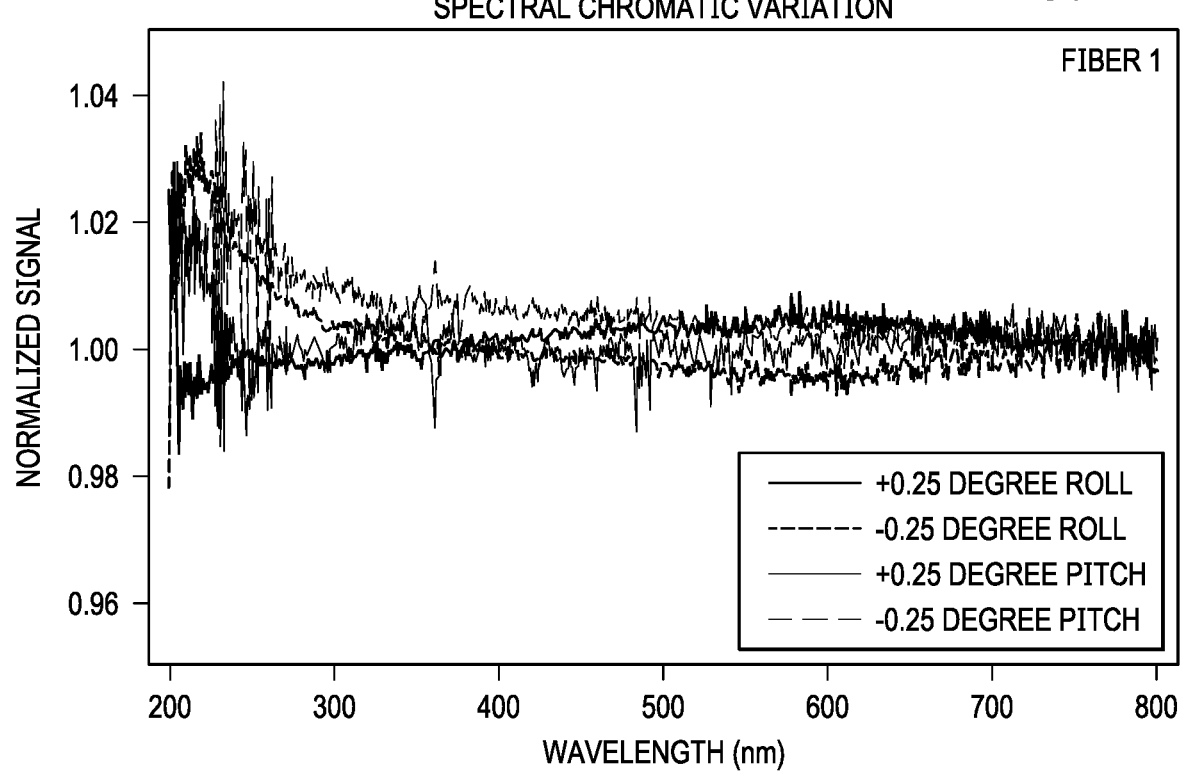
FIG. 1A
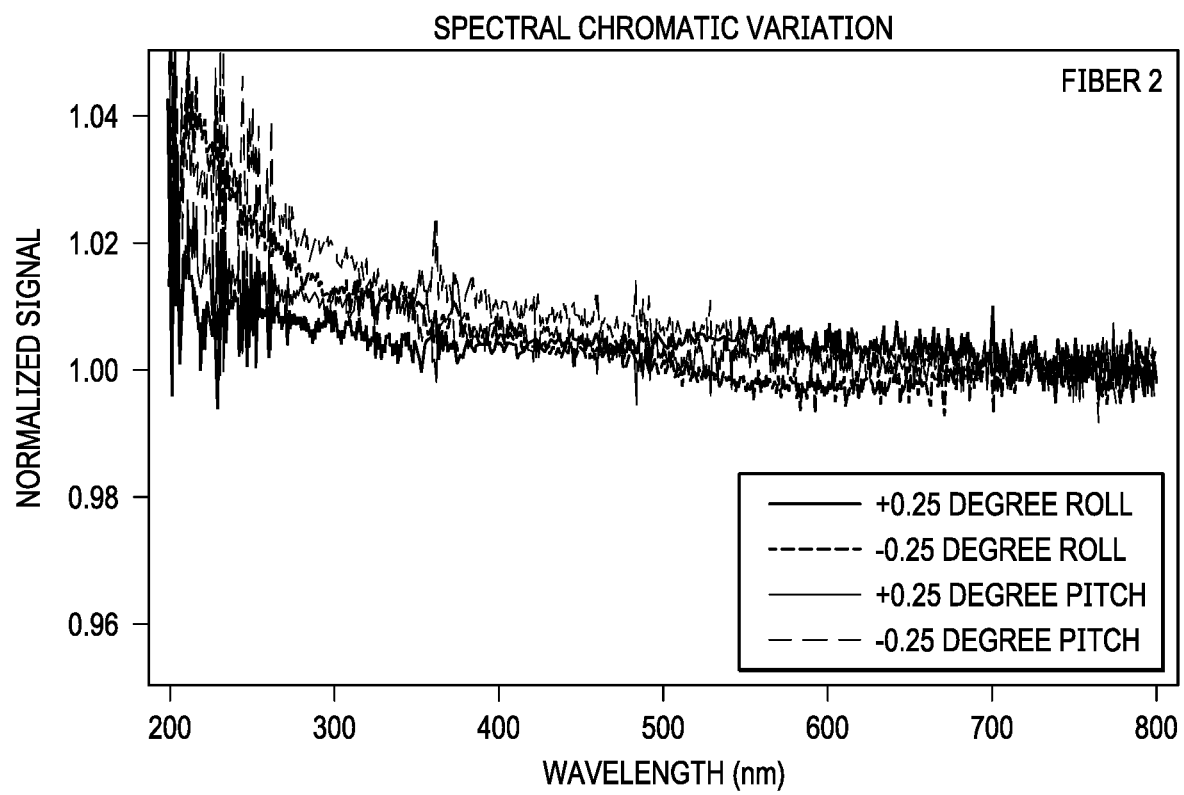

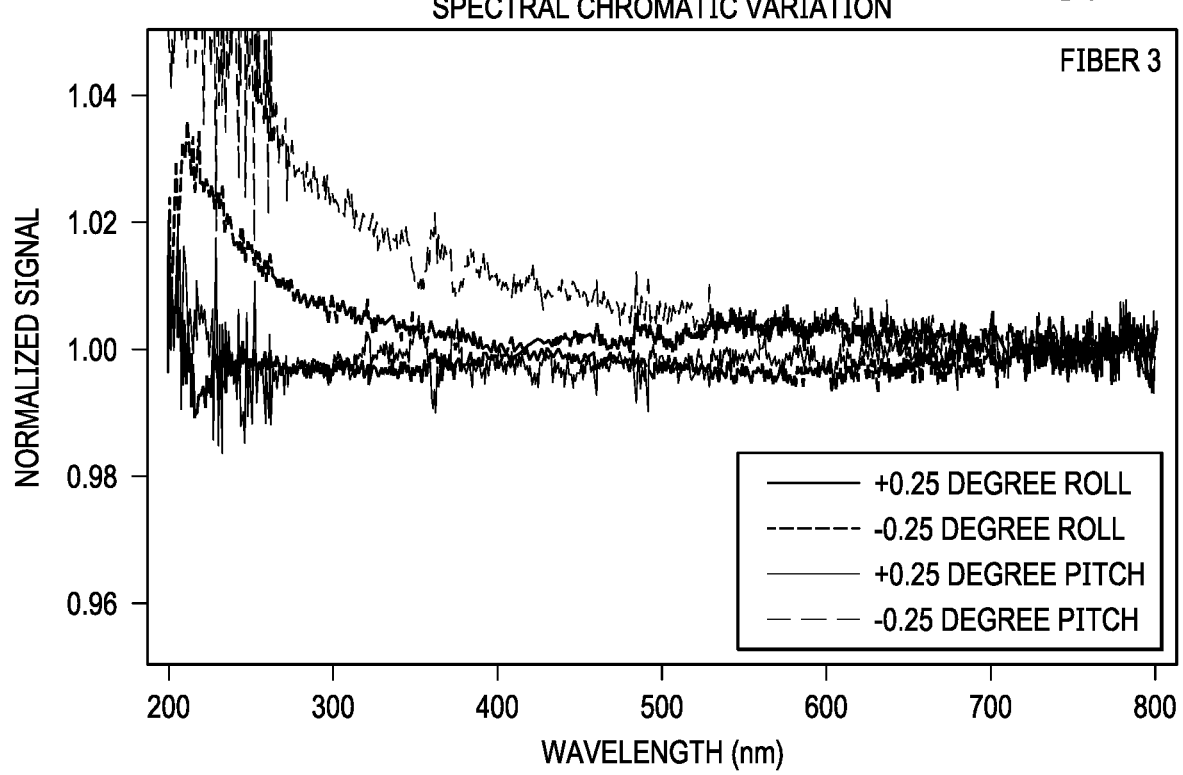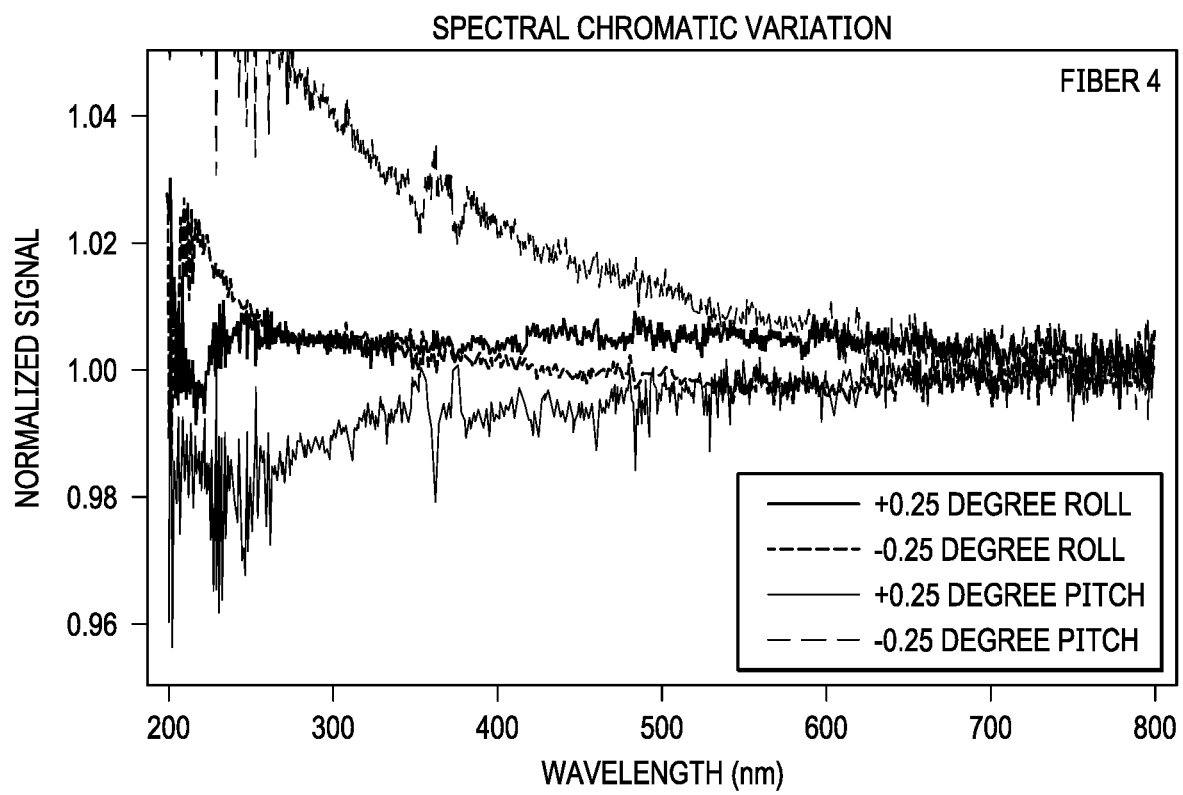
FIG. 1B

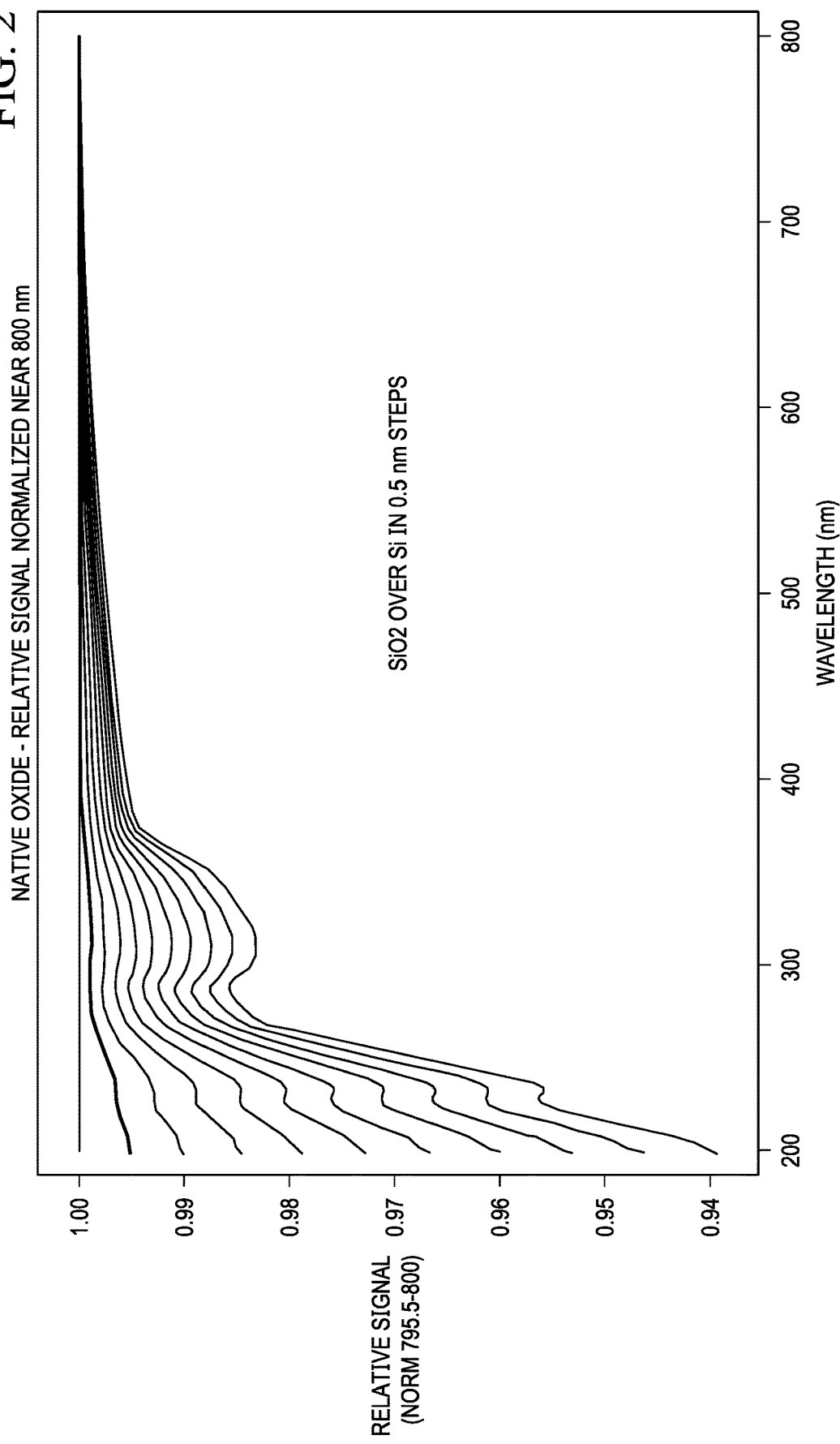

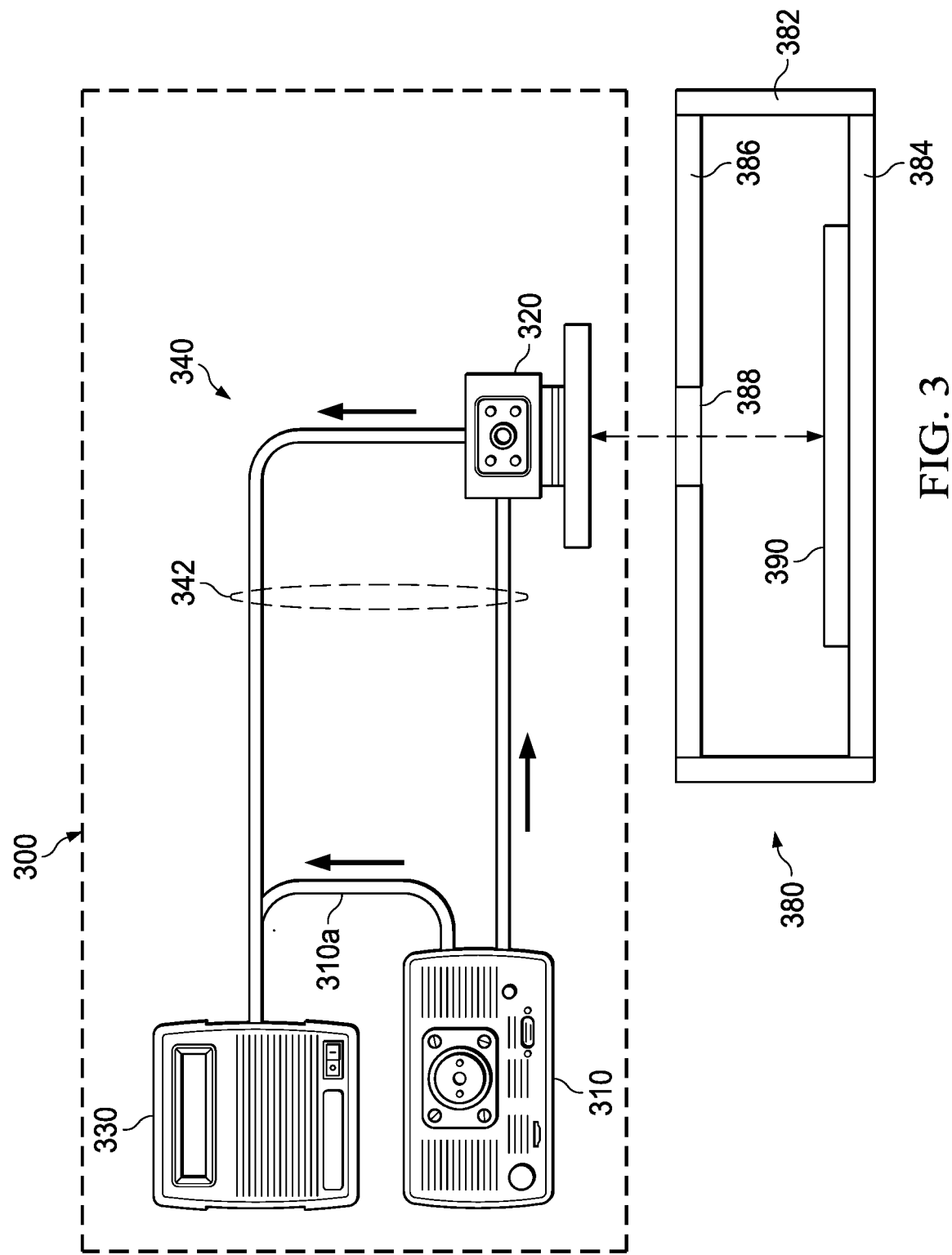

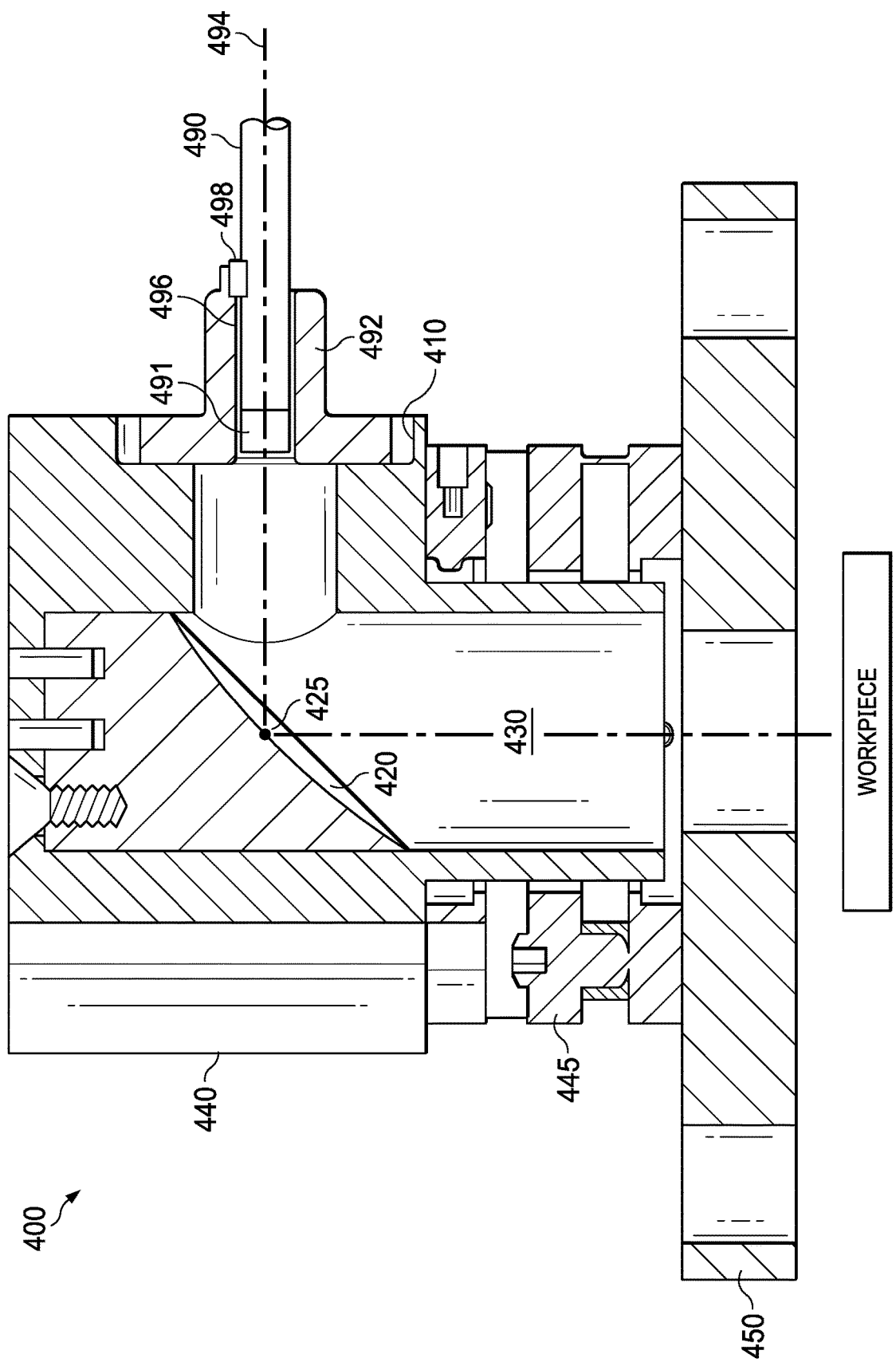

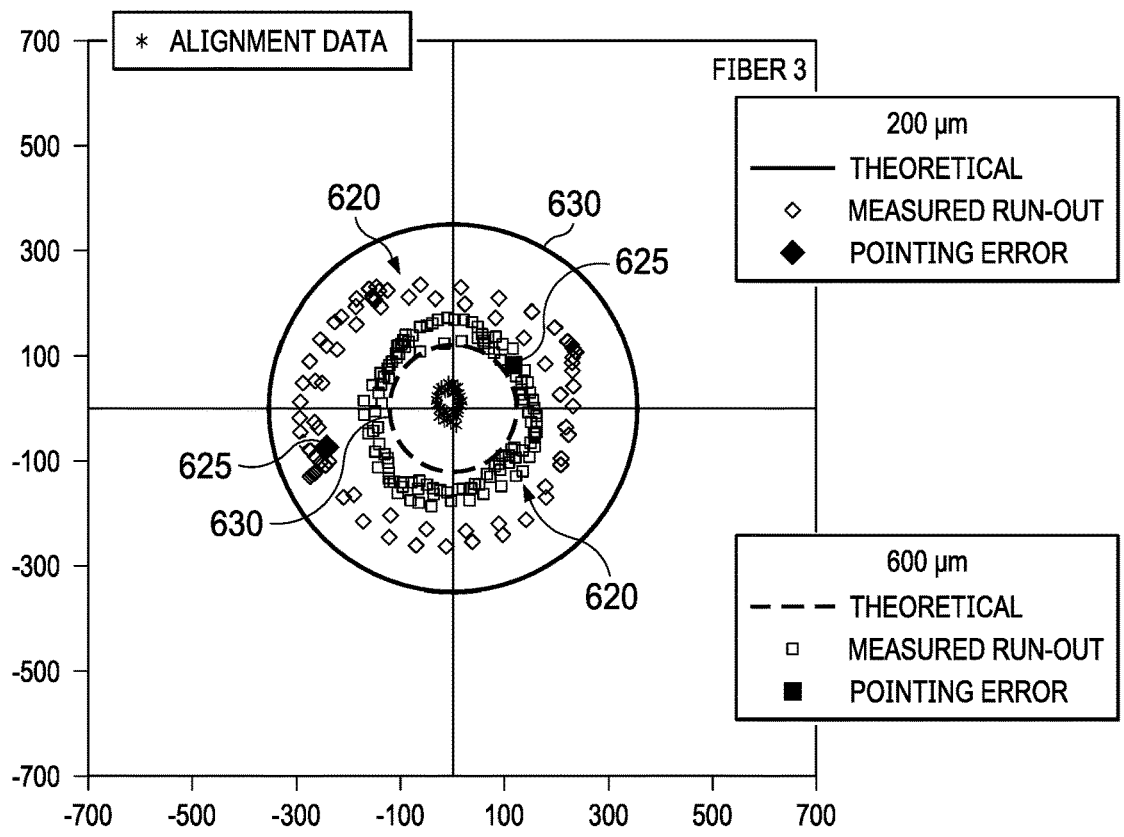
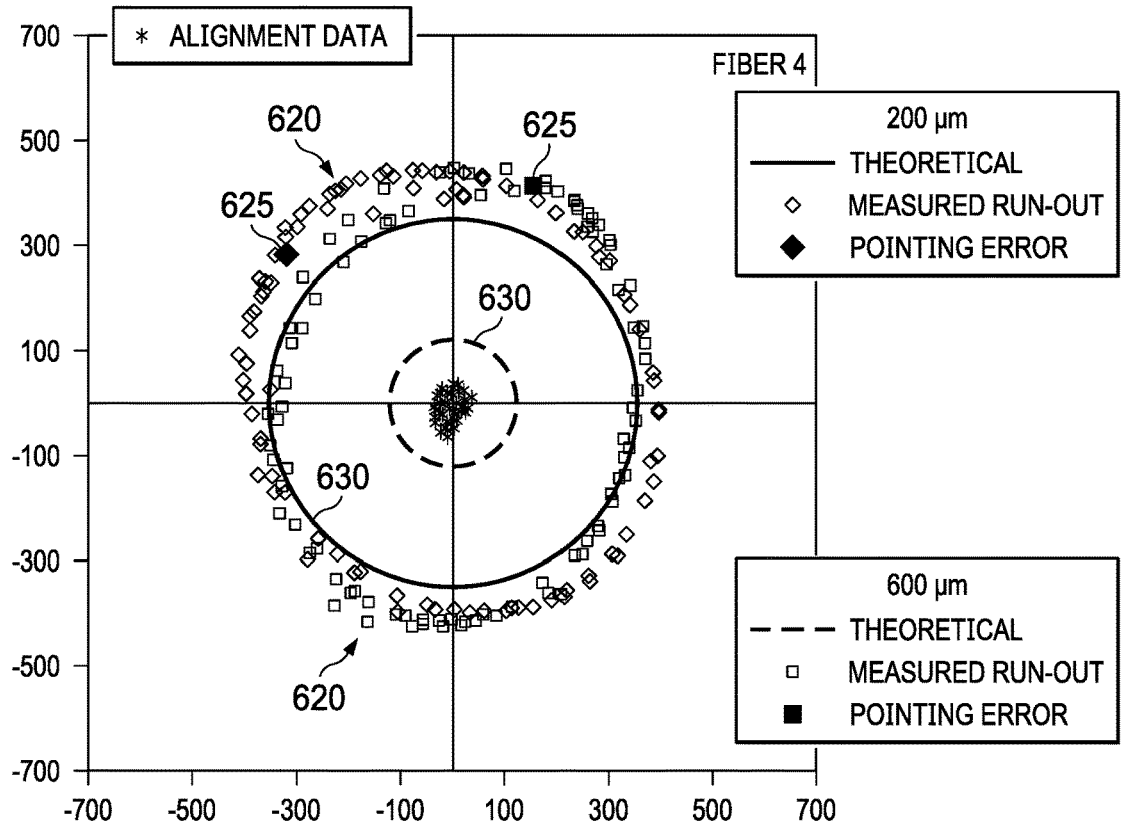
FIG. 6B

FIBEROPTICALLY-COUPLED MEASUREMENT SYSTEM WITH REDUCED SENSITIVITY TO ANGULARLY-DRIVEN VARIATION OF SIGNALS UPON REFLECTION FROM A WAFER

CROSS-REFERENCE TO RELATED APPLICATION

This application claims the benefit of U.S. Provisional Application Ser. No. 62/807,992, filed on Feb. 20, 2019, entitled "FIBEROPTICALLY-COUPLED MEASUREMENT SYSTEM AND REDUCED SENSITIVITY TO ANGULARLY-DRIVEN VARIATION OF SIGNALS UPON REFLECTION FROM A WAFER," commonly assigned with this application and incorporated herein by reference in its entirety.

TECHNICAL FIELD

This application is directed, in general, to optical monitoring of semiconductor wafers and, more specifically, to optical monitoring with reduced sensitivity to angularly-driven variations.

BACKGROUND

Optical monitoring of semiconductor processes is a well-established method for controlling processes, such as etch, deposition, chemical mechanical polishing and implantation. Optical emission spectroscopy ("OES") and interferometric endpoint ("IEP") are two essential methods for collection of optical signal data. In IEP applications, light is typically supplied from an external source, such as a flashlamp, and directed onto a workpiece. Upon reflection from the workpiece, the sourced light is amplitude modulated depending on the wavelength of light and the complex reflectance properties of the workpiece. Information regarding the state of the workpiece is available from the reflected amplitude modulated source light. Extraction and modeling of the reflectance of the workpiece permits understanding of film thickness, feature sizes/depth/widths, and other properties of the workpiece during semiconductor processes.

The extraction and modelling of the reflectance of the workpiece is generally based on the workpiece being planar with a fixed alignment with respect to the optical system interrogating the workpiece. During semiconductor processes, however, a workpiece may be perturbed and the perturbations, in general, change the orientation with respect to the light directed to and reflected from workpiece and the workpiece itself. For example, a workpiece can have a certain thickness during the semiconductor process that does not change. However, due to thermal changes resulting in varied stresses on the workpiece, the shape of the workpiece can change from being planar to either convex or concave. Even though the thickness remains the same, the curved surface of the workpiece perturbs the interrogating light from the optical system. This perturbation then changes the spatial and angular properties of the light upon reflection and can provide erroneous results by impacting how the reflected light is passed through the optical system to be received and processed by an optical detector.

SUMMARY

In one aspect, the disclosure provides an optical system having an off-axis parabolic (OAP) mirror collimator. In one embodiment, the OAP mirror collimator includes a housing, an OAP mirror within the housing and having an optical axis, a fold plane, and a focal point. A fiber optical cable is coupled to the housing, the fiber optical cable comprising first and second optical fibers, each having an exit end that form a common end face of the fiber optic cable, wherein the fiber optical cable is rotationally and translationally aligned to the OAP mirror such that the common face is perpendicular to and centered upon the optical axis of the OAP mirror and positioned a fixed distance from the focal point, and wherein the optical axes of the first and second optical fibers are jointly angularly aligned to the fold plane, and the optical axes of the first and second optical fibers deviate from being parallel to the optical axis by no more than 0.15 degrees.

In another aspect, the disclosure provides a processing system for a workpiece. In one embodiment, the processing system includes a processing chamber having a top with a viewport and a base that supports a workpiece during processing. An optical system having a collimator is positioned on the viewport to optically monitor the workpiece during processing. The collimator comprises a housing, an OAP mirror within the housing and having an optical axis, a fold plane and a focal point, and a fiber optical cable coupled to the housing. The fiber optical cable comprising first and second optical fibers, each having an exit end that form a common end face of the fiber optic cable, wherein the fiber optical cable is rotationally and translationally aligned to the OAP mirror such that the common face is perpendicular to and centered upon the optical axis of the OAP mirror and positioned a fixed distance from the focal point, and wherein optical axis of the first and second optical fibers are jointly angularly aligned to the fold plane, and the optical axes of the first and second optical fibers deviate from being parallel to the optical axis of the OAP mirror by no more than 0.15 degrees. A spectrometer is optically connected to the collimator by the first optical fiber, and a flashlamp is optically connected to the collimator by the second optical fiber.

In yet another aspect, the disclosure provides a method of monitoring a semiconductor process. In one embodiment, the method of monitoring includes positioning a workpiece in optical alignment with optical system having a collimator that comprises a housing, an OAP mirror within the housing and having an optical axis, a fold plane and a focal point, and a fiber optical cable coupled to the housing. The fiber optical cable comprises first and second optical fibers, each having an exit end and that form a common end face of the fiber optic cable, wherein the fiber optical cable is rotationally and translationally aligned to the OAP mirror such that the common face is perpendicular to and centered upon the optical axis of the OAP mirror and positioned a fixed distance from the focal point, and wherein optical axis of the first and second optical fibers are jointly angularly aligned to the fold plane, and the optical axes of the first and second optical fibers deviate from being parallel to the optical axis of OAP mirror by no more than 0.15 degrees. Light is directed from a light source through a first optical fiber that optically couples the light source to the collimator. Collected light is reflected light from the surface of the workpiece through the second optical fiber, and sent to an optical detector from the collimator by way of the second optical fiber that optically couples the optical detector to the collimator.

BRIEF DESCRIPTION

Reference is now made to the following descriptions taken in conjunction with the accompanying drawings, in which:

FIGS. 1A-1B illustrates plots showing a range of problems associated with angular variability of the alignment of the optical system and the wafer;

FIG. 2 illustrates theoretical curves of an $SiO_2$ film;

FIG. 3 illustrates a schematic diagram of an example of an IEP system constructed according to the principles of the disclosure;

FIG. 4 illustrates an example of an off-axis parabolic (OAP) mirror-based, collimator constructed according to the principles of the disclosure;

FIGS. 6A-6B shows a set of plots illustrating variations of run-out and pointing error associated with the chromatic performance as shown in FIGS. 1A-1B.

DETAILED DESCRIPTION

Figure 5:
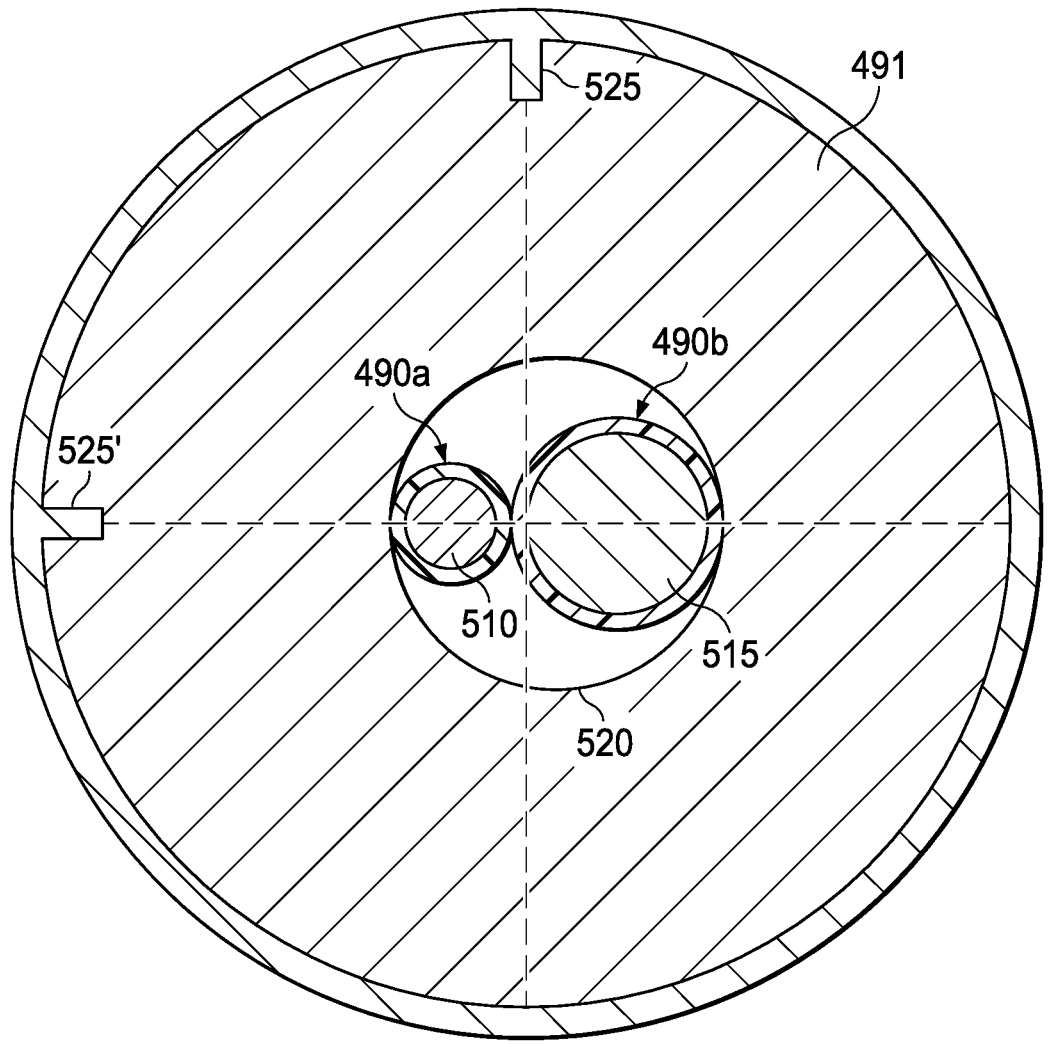
FIG. 5 illustrates an end view of an example of an optical fiber cable employed in a fiber channel of a fiber receiver, such as fiber receiver of FIG. 4.

In some semiconductor processes, high accuracy and precision measurement of workpiece properties are critical for process control where changes in thickness of a few atomic layers can alter a semiconductor element from operable to faulty. It is possible to perform high quality measurements inline and in situ in semiconductor tools but both wafer and tool conditions can limit the accuracy and precision of these measurements.

Two common issues limiting the accuracy and precision are the variable planarity of workpieces and the variable orientation of workpieces to controlled axes of interrogating optical measurement systems. Considering the example of a uniformly coated but concave spherically curved workpiece, it can be readily shown that a thickness measurement taken near the center of the workpiece will differ from that taken at the edge of the workpiece by factors proportional to the radius of curvature and diameter of the workpiece. Even minute curvatures can result in errors in film thicknesses of 10's of Angstroms.

Considering the variable orientation of workpieces to controlled axes of interrogating optical measurement systems, it may be recognized that mechanical systems, in general, do not maintain perfect alignments and that external influences such as mechanical impact, temperature, vibration, and creep will adversely change alignments. Thus, an original alignment of a workpiece can change during a semiconductor process due to various factors.

The plots of FIGS. 1A-1B illustrate a range of problems associated with angular variability of the alignment of the optical system and the wafer. Each plot has been normalized to remove the impact from overall signal intensity variation, since this type of variation may be addressed by other signal processing techniques, and leave only the relative spectral chromatic variation. Ideally, each of the curves is flat and is at a value of 1.00 indicating no spectral chromatic variation. Each individual curve of each plot indicates the relative spectral chromatic variation induced by a 0.25 degree change in relative orientation (pitch, roll) between the optical system and the wafer. Specifically, each plot may represent a set of 0.25 degree positive and negative pitch and roll orientations of collimators used in the optical system with respect to the surface normal of the workpiece. Although, the plots of FIGS. 1A-1B show the spectral chromatic variation over a wavelength range of 200 to 800 nm; other wavelength ranges can express the same variations especially in the UV and DUV regions of the spectrum where refractive properties of materials are known to be more strongly dependent upon wavelength.

For each plot, different optical fiber cables have been used with other components of the optical system remaining fixed. Though the plots are from different fiber cables, each of the fiber cables has the same nominal specifications. Variations between the different fiber cables can be due to manufacturing of the fibers of the fiber cable, assembling of the fiber cables, and/or connection of the fiber cables with other optical system components. The four different fibers used in the plots of FIGS. 1A-1B are the same fibers represented by the performance data in FIGS. 6A-6B.

Though a quarter degree change is small, the resultant chromatic variation can provide an error in thickness determination of ten's to hundreds of Angstroms. This may be understood by comparing the lower right plot of FIGS. 1A-1B and the theoretical curves of, for example, $SiO_2$ film as illustrated in the plot of FIG. 2. For this $SiO_2$ film, a 4% chromatic variation can result in an error in the film thickness determination of ~35 Angstroms. For a semiconductor product such as 3D NAND memory, this error can be the difference between a working product and a non-working product.

A third issue limiting the accuracy and precision of measuring workpiece properties is the propagation of light through an optical measurement system. This issue is often coupled with the first two issues, since imperfections in the optical measurement system may manifest upon slight changing in the presentation of optical signals to such systems. For example, a slight change of incident angle of light upon a coated surface can result in well-known chromatic "blue-shift" of reflected spectra. An example of a coated surface is the mirror of an OAP collimator.

To compensate for various issues, such as noted above, that limit the accuracy and precision of measuring workpiece properties, optical measurement systems need to be designed and configured to reduce these sensitivities.

Accordingly, the disclosure provides systems (e.g., collimator system, optical fiber subassembly, optical monitoring system) and methods that reduce angular sensitivity to compensate for misalignment between the workpiece and the interrogating optical signals. The misalignment can be due to the workpiece itself or due to the optical monitoring system or components thereof, such as the collimator. The system provides specific arrangements and configurations of the components to achieve measurement results having a reduced sensitivity to geometric variables, such as when the workpiece is tilted. Improvements in both the light delivery and light detection of optical monitoring systems are provided. For example, details of improved light delivery interfaces between the collimator and optical fiber assemblies are disclosed herein.

Advantageously, the disclosed systems, apparatuses, and methods allow the measurement of the workpieces during various stages of semiconductor processes. The system may be used when the workpiece is within a processing chamber (in situ) or being moved during a semiconductor process (in-line), such as from one processing chamber to another processing chamber.

The performance of optical components in systems are often idealized, but in actuality, include refractive effects from dielectric subcomponents and other effects that can impact chromatic performance as shown in FIGS. 1A-1B. The fiber optic cables, the coating of an off-axis parabolic (OAP) mirror, and the workpiece, and internal components of spectrometers (e.g., filters, gratings, slits) and flashlamps (e.g., arc dimensions and chromatic variation) can all impact spatial and angular propagation of light and can impact chromatic performance.

An OAP mirror is usually regarded as a perfectly achromatic component, but the protective overcoat will be a dielectric material and will have wavelength dependent effects. Fiber optical cables are most usually made of glass and inherently have wavelength dependent numerical aperture (NA) and propagation. Typical fibers are designed with a nominal 0.22 NA, but this is wavelength dependent and during actual use, the fiber may be non-uniformly filled or under-filled based upon the light field intercepted from a flashlamp and the spatial and angular properties of light reflected from a workpiece. Similarly, the light transmitted by a fiber may be spatially subsampled by the spectrometer slit.

A central component for the performance of the optical monitoring system is the collimator which forms and shapes the angular and spatial properties of the light interrogating the wafer and transfers that light to/from the fiber optic cables and spectrometer/flashlamp. FIG. 3 illustrates an optical monitoring system that employs a collimator such as disclosed herein.

FIG. 3 illustrates a schematic diagram of an example of an IEP optical monitoring system 300 constructed according to the principles of the disclosure. The IEP system 300 provides an example of an in-situ environment wherein the IEP system 300 is employed to interrogate a workpiece in a semiconductor tool 380. Generally, the IEP system 300 includes a flashlamp 310 that provides an optical signal to a collimator 320, as provided by this disclosure, which is used to interrogate a wafer 390 in the semiconductor tool 380. Light reflected from the wafer 390 is subsequently collected by a spectrometer 330. Optionally, the flashlamp 310 may be optically coupled to the spectrometer 330 by a referencing optical cable 310a to provide light directly to the spectrometer 330 for signal referencing purposes. Optical signals are commonly transported by fiber optic assemblies 340 between the flashlamp 310, the collimator 320, and the spectrometer 330. One of the fiber optic assemblies 340 is denoted as a fiber optic cable 342.

The flashlamp 310 can be a conventional light source that is used for optical monitoring of semiconductor processes. The flashlamp 310 can be, for example, a xenon flashlamp such as a Series 1100 flashlamp from Excelitas or a type of continuous source or other pulsed source that produces light in an approximately microsecond optical pulse. The flashlamp 310 delivers an interrogating light to the collimator 320 via the fiber optic cable 342.

The collimator 320 is coupled to the fiber optic cable 342 and is positioned to deliver the interrogating light to the wafer 390 via a viewport 388 of the semiconductor tool 380. The collimator 320 is constructed to reduce angular sensitivity due to optical misalignment between the wafer 390 and the optical signals (light) delivered to and reflected from the wafer 390. The collimator 320 can be an off-axis parabolic (OAP) mirror-based collimator such as disclosed in FIG. 4.

The spectrometer 330 detects and converts the optical signals received from the collimator 320 via the fiber optic cable 342 to electrical signals. The spectrometer 330 can then send the electrical signals to a signal processor (not shown). The spectrometer 330 can amplify and digitize the electrical signals before sending the electrical signals to a signal processor. The signal processor can be, for example, an industrial PC, PLC or other computer or computer system which employs one or more algorithms to produce an output that corresponds to the optical signals collected from the observed wafer 390 within the semiconductor tool 380.

The algorithm can be an IEP algorithm that analyzes intensity signals at predetermined wavelength(s) and determines trend parameters that relate to the state of a process and can be used to access that state, for instance end point detection, etch depth, etc. The output from the signal processor can be, for example, an analog or digital control value representing the intensity of a specific wavelength, a ratio of two wavelength bands, or a thickness value. Output values can be transferred to semiconductor tool 380 via a communication link (not shown) for monitoring and/or modifying the production process occurring within the semiconductor tool 380. Instead of a separate device, the signal processor can be integrated with spectrometer 330. The spectrometer 330 can be a known spectrometer used for optical monitoring of semiconductor processes such as the Verity Instruments, Inc. SD1024G-series spectrometer.

The fiber optic assemblies 340 are configured to direct interrogating light to the wafer 390 via the collimator 320 and direct reflected light collected from the wafer 390 via the collimator 320 to the spectrometer 330. In one embodiment, The the fiber optic cable 342 is a bifurcated fiber optic assembly having two side-by-side fibers at one end (at the interface to the collimator 320) and two legs at the other end with one of the fiber legs connected to the flashlamp 310 and the other fiber leg connected to the spectrometer 330.

The semiconductor tool 380 can be a conventional semiconductor tool configured to process semiconductors. The semiconductor tool 380 includes a housing 382, a base 384, a lid 386, and a viewport 388. The volume of the semiconductor tool 380 is defined by the housing 382 and the lid 386. The viewport 388 provides a visual opening for monitoring the wafer 390 during processing within the semiconductor tool 380. The collimator 320 is positioned with respect to the viewport 388 to provide light from the flashlamp 310 upon the wafer 390 and receive reflected light from the wafer 390 to the spectrometer 330. The collimator 320 can be attached to lid 386 via mounting hardware (not shown) to precisely locate and securely fix the collimator 320 to the semiconductor tool 380. The mounting hardware can be constructed to provide consistent positioning of the collimator 320 within similar semiconductor tools to assist in ensuring that desired measurement accuracy and consistency is achieved.

FIG. 4 illustrates an example of an off-axis parabolic (OAP) mirror-based, collimator 400 constructed according to the principles of the disclosure. The collimator 400 can be used with the optical monitoring system of FIG. 3. The collimator 400 includes a connector port 410, an OAP mirror 420, an optical channel 430, a housing 440, and a base 450. The OAP mirror 420 and optical channel 430 are located within the housing 440. The housing 440 is affixed to the base 450, such as via a mechanical connector(s) and the base 450 is used to securely affix the collimator 400 to a structure, such as to a support above an arm used to transport workpieces, or proximate a viewport on a top or lid of a processing chamber. Mechanical connectors such as bolts and screws can be used with the illustrated through holes to secure the base 450 to a structure. An alignment mechanism such as a tip/tilt adjustable stage 445 may be positioned between housing 440 and base 450 to support adjustment of the optical orientation of collimator 400 to the workpiece. The mirror 420 has a focal point 425 positioned on an optical axis 494, proximate fiber receiver 492 and fiber optic cable 490 and a fold plane. The fold plane of mirror 420 is generally represented by the indicated dash-dot lines and lies in the plane of the cross-section of collimator 400 shown in FIG. 4. A fold plane may generally be defined as the plane in which an optical element, such as OAP 420 changes the direction of optical axis 494.

During operation of the collimator 400, light exits a fiber of a fiber optic cable 490 along the optical axis 494 through a fiber receiver 492 positioned in the connector port 410 of the collimator 400. The light then reflects off the surface of the mirror 420 and may be nominally collimated or focused prior to interaction with a workpiece positioned external to collimator 400 and nominally aligned with the vertical portion of the optical channel 430. The relative position of the end of the fiber optic cable 490 and the mirror 420 in relation to the focal length of the mirror 420 defines the (de)focus or collimation condition of the collimator 400. Specific positioning of the fiber receiver 492 or fiber 490 along the optical axis 494 can be used to add an amount of defocus (e.g., 1 mm, or 0 to +/−5 mm) that assists in blurring the interrogating light, reducing the degree of collimation, and results in a reduction of the impact of tilting on signal loss. Defocus may be positive or negative depending upon if the end of fiber optic cable 490 is closer or farther away from mirror 420 than the focal length. The connector port 410 can be recessed into the surface of the housing 440 as shown in FIG. 4 to provide the negative defocus. In one example, a distance between a reference surface of the fiber receiver 492 and the focal point 425 is established to provide one millimeter (1 mm) of defocus distance between the focal point 425 and an exit face of fiber optic cable 490, as discussed below. The defocus distance may also be defined with respect to other reference surfaces such as the interface between fiber receiver 492 and housing 440. Generally, it is desirable to position the exit face of fiber optic cable 490 within +/−3 mm or so of the focal point 425. Instead of a recessed connector port 410, defocusing can be obtained in other ways, such as a connector port that protrudes from the housing 440 or by varying the length of portions of fiber optic cable 490 which engages fiber receiver 492.

The fiber receiver 492 includes a fiber channel 496 that supports a pair of fibers of the fiber optic cable 490. The fiber receiver 492 also includes an alignment key 498 that interacts with the fiber optic cable 490 to maintain the orientation of the pair of optical fibers about the optical axis. The alignment key 498 can cooperate with an alignment key receiver or notch, such as illustrated in FIG. 5 for alignment. The alignment key 498 and alignment key notch can be a male/female pair. In various examples, the fiber receiver 492 can be a conventional fiber receiver, such as a SubMiniature version (SMA) connector. Other types of fiber optic connectors can also be used, including FC, PC, APC, ST, SC and custom designs. The fiber receiver 492 can attach to connector port 410 via mechanical connectors, such as bolts. As shown in FIG. 4, the alignment key 498 is formed as part of fiber receiver 492 and is convenient for an SMA connector interface. However other configurations of alignment features may be used and may be directly integrated with housing 440 or other elements of collimator 400 and fiber optic cable 490.

The fiber optic cable 490 includes a body 491 in which the pair of fibers are terminated. The body 491 may be of any type of construction that can hold the fibers in place, such as a collar, an example of which is a ferrule. Alternatively, the body 491 may be an adhesive body that holds the fibers together. One of the fibers is used to deliver light to the collimator 400 and then the workpiece and the other fiber of the fiber optic cable 490 is used to collect light after reflection from the workpiece. The fiber optic cable 490 can be the fiber optic cable 342 of FIG. 3. In certain embodiments, the pair of fibers within the fiber optic cable 490 and positioned within the fiber channel 494 may be asymmetric fibers. The exit ends of the fibers of the fiber optic cable 490 may be nearly coincident with a face of the fiber receiver 492 that abuts to the surface of the connector port 410 depending upon the defocus distance. FIG. 5 illustrates an end view of an example of a fiber optic cable that can be the fiber optic cable 490.

FIG. 5 illustrates an end view of an example of an optical fiber cable employed in a fiber channel of a fiber receiver, such as fiber receiver 492 of FIG. 4. In one embodiment, the fiber optic cable 490 comprises first and second optical fibers 490a, 490b. In the illustrated embodiment of FIG. 5, the first optical fiber 490a may be a 200 micrometer diameter fiber and the second optical fiber 490b may be a 600 micrometer diameter fiber. The first and second optical fibers 490a, 490b each have exit ends 510 and 515, respectively that form a common end face 520. The fiber optic cable 490 may be rotationally and translationally aligned to the OAP 420 such that the common end face 520 is perpendicular to and centered upon the optical axis 494 and positioned a fixed distance from the focal point 425. Additionally, the optic axes of the first and second optical fibers 490a, 490b may be jointly angularly aligned to the fold plane of the OAP 420, and the optical axes of the first and second optical fibers 490a, 490b may deviate from being parallel to the optical axis 494 by no more than 0.15 degrees. In one embodiment, the alignment key 498 of fiber receiver 492 engages with an alignment key receiver 525, such as a notch, of the fiber optic cable 490 to ensure the desired angular orientation of the first and second optical fibers 490a, 490b with respect to the optical axis 494 and/or the fold plane of the OAP mirror. The alignment key 498 and alignment key receiver 525 can be located at different locations to provide the desired alignment. In FIG. 5 the alignment key receiver 525 is located at "12 o'clock". An alternative alignment key receiver 525' position is shown at "9 o'clock" to illustrate different locations are possible. The second optical fiber 490b may be used to source light from the flashlamp and the first optical fiber 490a may be used to collect and transmit light to the spectrometer for measurement. The combination of the asymmetric fiber design and defocus blurring provides amplitude desensitivity such that the misalignment of the example quarter degree may only result in a 10% signal loss rather than 90% in a symmetric and focused system. Given the general relationship $y=f*\Theta$, where f is focal length, $\Theta$ is wafer tilt angle, and y is displacement of the reflected light in the plane of the end of the fiber optic cable, this expression indicates that to keep y small for a given $\Theta$, decrease f. That is, for example, shorter focal lengths result in less displacement of the reflected light from the second optical fiber 490b and more easily received by the first optical fiber 490a. A suitable range of focal lengths for the OAP 420 include the range from approximately 10 to 40 mm. Similarly, a larger "source" fiber diameter of fiber 490b permits displacement of the reflected light to remain coverage of the smaller diameter fiber 490a. In some examples, the horizontal position of the first optical fiber 490a and the second optical fiber 490b can be switched (exchange of fibers right-to-left and left-to-right in FIG. 5). The center line of the fiber receiver 492 may coincide with the optical axis 494 through fiber receiver 492. Alternatively, second optical fiber 490b may be a plurality of optical fibers surrounding or adjacent to first optical fiber 490a. For example, both the first optical fiber and the plurality of second optical fibers may be of 200 micrometer diameters and the fiber may be configured as a hex-packed coaxial bundle of a total of 7, 14 or other total individual fiber counts.

Figure 6A:
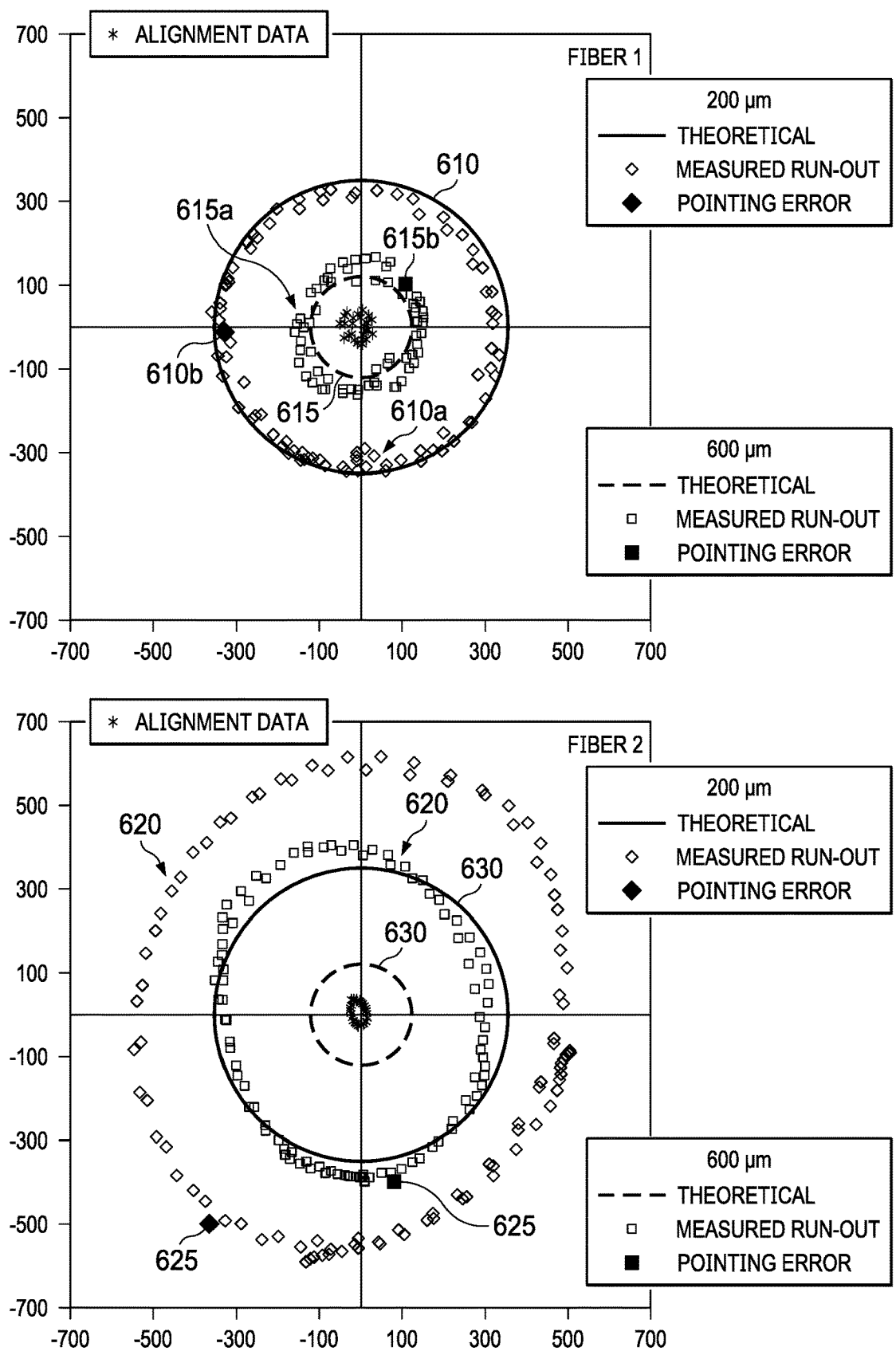

Internal to the optical fiber cable 490, the mechanical alignment of the individual first and second optical fibers 490a, 490b to the optical axis 494 may impose spatial and angular variations into the light propagation and impact the chromatic performance. FIGS. 6A-6B shows a set of plots illustrating variations of run-out and pointing error associated with the chromatic performance as shown in FIGS. 1A-1B. FIGS. 6A-6B illustrates plot graph results of 4 different optical fiber cables. FIBER 1 are results obtained from the optical monitoring system and OAP collimator covered by this disclosure. The outer circle 610 represents a theoretical runout of a 200 micron optical fiber and the inner circle 615 represents a theoretical runout of a 600 micron optical fiber. It should be noted that these same fiber sizes were used for FIBERS 2-4. Also, shown is the pointing error 610b of the 220 micron optical fiber, and 615b represents the pointing error of the 600 micron optical fiber. As generally known, runout may be defined as the inaccuracy of rotation of a feature, in this case the centroid of the light field, approximating the fiber axis, from an optical fiber, as the feature is rotated about an axis, in this case the center of the common end face and pointing error may be defined as the angle between an optical axis and the centroid of a light field to/from and optical fiber. Runouts shown in FIG. 6 are measured with a projected distance of 8.6 mm from the common end face to the detector.

Data points 610a represent the runout of the first optical fiber, and data points 615a represent the runout of the second optical fiber, as discussed above regarding embodiments of a collimator of this disclosure. As seen by the data points 610a and 615a, both the runout and pointing error of each of the first and second fibers are a close to the theoretical values, which increases the accuracy of the measurement results by reducing the effects of chromatic variation as shown in related plot of FIGS. 1A-1B. FIBERS 2-4 are results obtained from optical fibers and collimators that do not utilize the embodiments of this disclosure. As seen from these data plots, either the runout 620 or the pointing error 625, or both, deviate from the theoretical values 630 significantly more than those of FIBER 1. In general, the greater the degree of run-out or pointing error of one or both fibers, the greater the chromatic variation observed. As seen by comparing the corresponding plot of FIG. 1 and FIGS. 6A-6B, the chromatic variation was significantly reduced when using the collimator and optical fiber of this disclosure. It may be understood that the run-out and pointing error presenting in the plot of FIGS. 6A-6B are not fully independent. The pointing error may be interpreted as a specific condition of the run-out when associated with a specific orientation such as that defined by an alignment feature. Furthermore, in certain embodiments, pointing error may be nulled by rotation of a fiber optic cable and the use of alignment features would not be used as they would restrict the ability to rotate.

Figure 7:
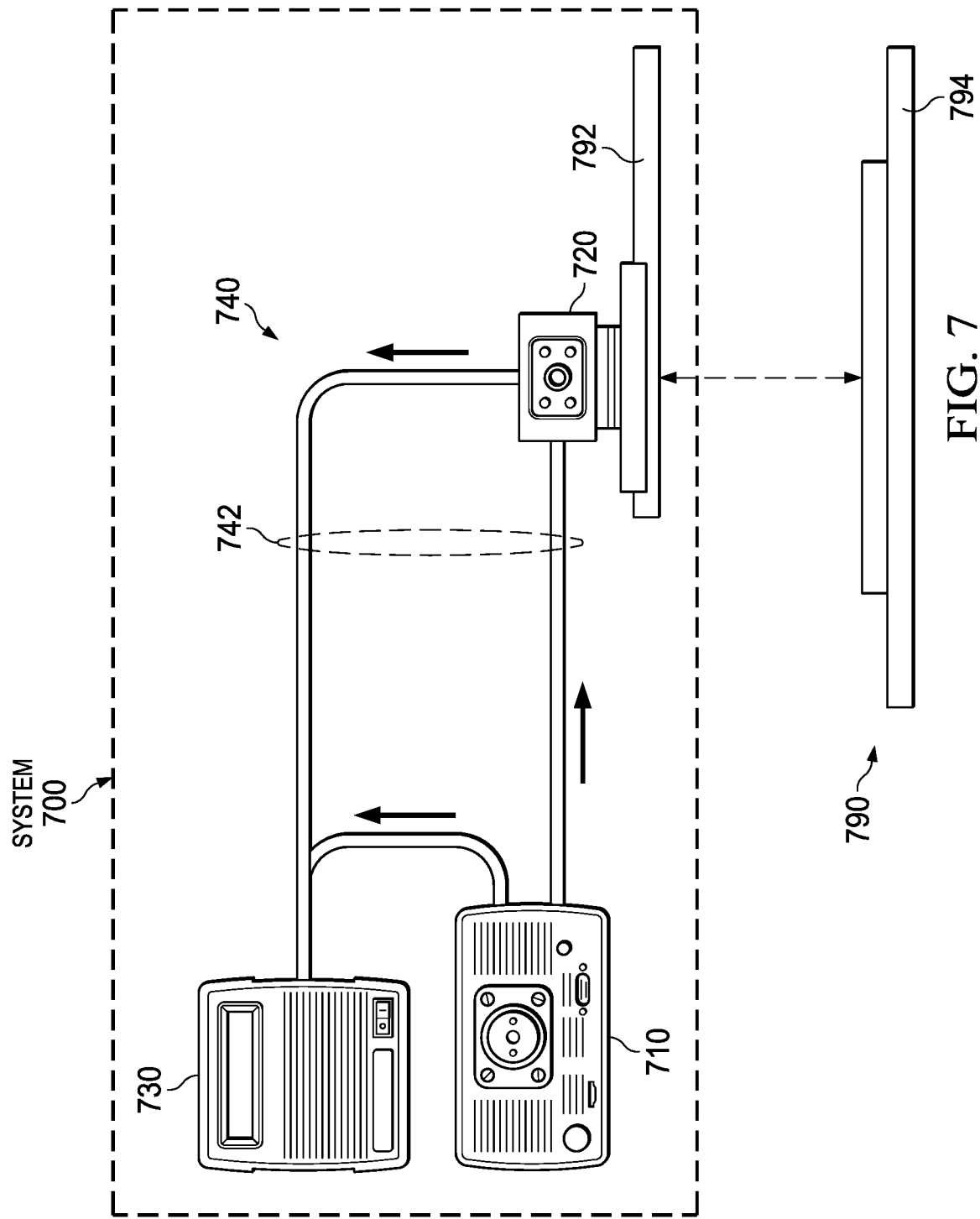
FIG. 7 illustrates an example of an in-line optical monitoring system constructed according to the principles of the disclosure.

FIG. 7 illustrates an example of an in-line optical monitoring system 700 constructed according to the principles of the disclosure. The optical monitoring system 700 is similar to the optical monitoring system 300 of FIG. 3 except collimator 720 is used in an in-line system 790. Otherwise the components of the optical monitoring system 700 operate as the same components of the IEP system 300.

In the illustrated in-line system 790, the collimator 720 is affixed to a support 792 that is positioned above an arm 794 used to transport workpieces within a semiconductor tool.

The changes described above, and others, may be made in the optical measurement systems and subsystems described herein without departing from the scope hereof. For example, although certain examples are described in association with semiconductor wafer processing equipment, it may be understood that the optical measurement systems described herein may be adapted to other types of processing equipment such as roll-to-roll thin film processing, solar cell fabrication or any application where high precision optical measurement may be required. Furthermore, although the term "wafer" may have been used herein when describing aspects of the current invention; it should be understood that other types of workpieces such as quartz plates, phase shift masks, LED substrates and other non-semiconductor processing related substrates and workpieces including solid, gaseous and liquid workpieces may be used.

The embodiments described herein were selected and described in order to best explain the principles of the invention and the practical application, and to enable others of ordinary skill in the art to understand the invention for various embodiments with various modifications as are suited to the particular use contemplated. The embodiments described herein are in no way intended to limit the scope of the present invention as it may be practiced in a variety of variations and environments without departing from the scope and intent of the invention. Thus, the disclosure is not intended to be limited to the embodiment shown but is to be accorded the widest scope consistent with the principles and features described herein.

As will be appreciated by one of skill in the art, some of the functionality of components or devices of the disclosure, such as a signal processor, or parts thereof may be embodied as a method, system, or computer program product. Accordingly, the features disclosed herein, or at least some of the features, may take the form of an entirely hardware embodiment, an entirely software embodiment (including firmware, resident software, micro-code, etc.) or an embodiment combining software and hardware aspects all generally referred to herein as a "circuit" or "module." Some of the disclosed features may be embodied in or performed by various processors, such as digital data processors or computers, wherein the computers are programmed or store executable programs of sequences of software instructions to perform one or more of the steps of the methods. Thus, features or at least some of the features disclosed herein may take the form of a computer program product on a non-transitory computer-usable storage medium having computer-usable program code embodied in the medium. The software instructions of such programs can represent algorithms and be encoded in machine-executable form on non-transitory digital data storage media.

Thus, portions of disclosed examples may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Those skilled in the art to which this application relates will appreciate that other and further additions, deletions, substitutions and modifications may be made to the described embodiments.

Various aspects of the disclosure can be claimed including the systems and methods as disclosed herein. Aspects disclosed herein include:

A. An optical system having an off-axis parabolic (OAP) mirror collimator, comprising a housing, an OAP mirror within the housing and having an optical axis, a fold plane, and a focal point. A fiber optical cable is coupled to the housing, the fiber optical cable comprising first and second optical fibers, each having an exit end that form a common end face of the fiber optic cable, wherein the fiber optical cable is rotationally and translationally aligned to the OAP mirror such that the common face is perpendicular to and centered upon the optical axis of the OAP mirror and positioned a fixed distance from the focal point, and wherein the optical axes of the first and second optical fibers are jointly angularly aligned to the fold plane, and the optical axes of the first and second optical fibers deviate from being parallel to the optical axis by no more than 0.15 degrees.

B. A processing system for a workpiece, comprising a processing chamber having a top with a viewport and a base that supports a workpiece during processing. An optical system having a collimator is positioned on the viewport to optically monitor the workpiece during processing. The collimator comprises a housing, an OAP mirror within the housing and having an optical axis, a fold plane and a focal point, and a fiber optical cable coupled to the housing. The fiber optical cable comprising first and second optical fibers, each having an exit end that form a common end face of the fiber optic cable, wherein the fiber optical cable is rotationally and translationally aligned to the OAP mirror such that the common face is perpendicular to and centered upon the optical axis of the OAP mirror and positioned a fixed distance from the focal point, and wherein optical axis of the first and second optical fibers are jointly angularly aligned to the fold plane, and the optical axes of the first and second optical fibers deviate from being parallel to the optical axis of the OAP mirror by no more than 0.15 degrees. A spectrometer is optically connected to the collimator by the first optical fiber, and a flashlamp is optically connected to the collimator by the second optical fiber.

C. A method of monitoring a semiconductor process comprising: positioning a workpiece in optical alignment with optical system having a collimator that comprises a housing, an OAP mirror within the housing and having an optical axis, a fold plane and a focal point, and a fiber optical cable coupled to the housing. The fiber optical cable comprises first and second optical fibers, each having an exit end and that form a common end face of the fiber optic cable, wherein the fiber optical cable is rotationally and translationally aligned to the OAP mirror such that the common face is perpendicular to and centered upon the optical axis of the OAP mirror and positioned a fixed distance from the focal point, and wherein optical axis of the first and second optical fibers are jointly angularly aligned to the fold plane, and the optical axes of the first and second optical fibers deviate from being parallel to the optical axis of OAP mirror by no more than 0.15 degrees. Light is directed from a light source through a first optical fiber that optically couples the light source to the collimator. Collected light is reflected light from the surface of the workpiece through the second optical fiber, and sent to an optical detector from the collimator by way of the second optical fiber that optically couples the optical detector to the collimator.

Each of the aspects A, B, C, D, and E may have one or more of the following additional elements in combination:

Element 1: further comprising a fiber receiver coupled to the housing and having an optical fiber channel extending therethrough and aligning with the optical axis of the OAP mirror, and comprising a body having an alignment notch formed in an outer perimeter thereof, and wherein, the fiber receiver has an alignment key that cooperatively engages with the alignment notch of the body to jointly angularly align the optical axes of the first and second optical fibers to the fold plane of the OAP mirror.

Element 2: wherein the first and second optical fibers are asymmetric fibers.

Element 3: further comprising a plurality of second optical fibers.

Element 4: wherein the centers of each of the first and second optical fibers do not coincide with the optical axis of the OAP.

Element 5: wherein, a centerline of the body aligns with the optical axis of the OAP.

Element 6: wherein the fiber receiver is configured to receive the fiber optical cable and position the common end face of the fiber optical cable approximately 1 mm along the optical axis of the OAP mirror from the focal point of the OAP mirror.

Element 7: wherein a focal length of the OAP mirror is within the range from 5 mm to 50 mm.

Element 8: wherein the second optical fiber is used to source light and has a diameter at least two times greater than a diameter of the first optical fiber used to collect and transmit light.

Element 9: wherein the first and second optical fibers are positioned within the body such that a run-out of each of the first and second optical fibers is within +/−25 microns of nominal with a projected distance of 8.6 mm and a pointing error of each of the first and second optical fibers is less than 0.15 degrees, when the fiber optic cable is located within the fiber receiver.

Element 10: further comprising a fiber receiver coupled to the housing and having an optical fiber channel extending therethrough and aligning with the optical axis of the OAP mirror, and comprising a body having an alignment notch formed in an outer perimeter thereof, and wherein, the fiber receiver has an alignment key that cooperatively engages with the alignment notch of the body to jointly angularly align the optical axes of the first and second optical fibers to the fold plane of the OAP mirror.

Element 11: wherein the first and second optical fibers are asymmetric fibers.

Element 12: wherein the collimator is configured to receive the fiber optical cable and position the common end face of the fiber optical cable approximately 1 mm along the optical axis of the OAP mirror from the focal point of the OAP mirror.

Element 13: wherein the first and second optical fibers are positioned within the body such that a run-out of each of the first and second optical fibers is within +/−25 microns of nominal with a projected distance of 8.6 mm and a pointing error of each of the first and second optical fibers is less than 0.15 degrees, when the fiber optic cable is located within the fiber receiver.

Element 14: wherein collimator further comprises a fiber receiver coupled to the housing and having an optical fiber channel extending therethrough and aligning with the optical axis of the OAP mirror, and comprising a body having an alignment notch formed in an outer perimeter thereof, and wherein, the fiber receiver has an alignment key that cooperatively engages with the alignment notch of the body to jointly angularly align the optical axes of the first and second optical fibers to the fold of the OAP mirror.

Element 15: wherein the first and second optical fibers are asymmetric fibers.

Element 16: wherein the fiber receiver is configured to receive the fiber optical cable and to position the common end face of the fiber optical cable approximately 1 mm along the optical axis of the OAP mirror from the focal point of the OAP mirror.

Element 17: wherein the first and second optical fibers are positioned within the body such that a run-out of each of the first and second optical fibers is within +/−25 microns of nominal with a projected distance of 8.6 mm and a pointing error of each of the first and second optical fibers is less than 0.15 degrees, when the fiber optic cable is located within the fiber receiver.

What is claimed is:

1. An optical system having an off-axis parabolic (OAP) mirror collimator, comprising:
   a housing;
   an OAP mirror within the housing and having an optical axis, a fold plane and a focal point; and
   a fiber optical cable coupled to the housing, the fiber optical cable comprising first and second optical fibers, each having an exit end that form a common end face of the fiber optic cable, wherein the fiber optical cable is rotationally and translationally aligned to the OAP mirror such that the common face is perpendicular to and centered upon the optical axis of the OAP mirror and positioned a fixed distance from the focal point, and wherein the optical axes of the first and second optical fibers are jointly angularly aligned to the fold plane, and the optical axes of the first and second optical fibers deviate from being parallel to the optical axis by no more than 0.15 degrees.

2. The optical system as recited in claim 1, further comprising a fiber receiver coupled to the housing and having an optical fiber channel extending therethrough and aligning with the optical axis of the OAP mirror, and comprising a body having an alignment notch formed in an outer perimeter thereof, and wherein, the fiber receiver has an alignment key that cooperatively engages with the alignment notch of the body to jointly angularly align the optical axes of the first and second optical fibers to the fold plane of the OAP mirror.

3. The optical system as recited in claim 1, wherein the first and second optical fibers are asymmetric fibers.

4. The optical system as recited in claim 1, further comprising a plurality of second optical fibers.

5. The optical system as recited in claim 2, wherein the centers of each of the first and second optical fibers do not coincide with the optical axis of the OAP.

6. The optical system as recited in claim 2, wherein, a centerline of the body aligns with the optical axis of the OAP.

7. The optical system as recited in claim 2, wherein the fiber receiver is configured to receive the fiber optical cable and position the common end face of the fiber optical cable approximately 1 mm along the optical axis of the OAP mirror from the focal point of the OAP mirror.

8. The optical system as recited in claim 1, wherein a focal length of the OAP mirror is within the range from 5 mm to 50 mm.

9. The optical system as recited in claim 3, wherein the second optical fiber is used to source light and has a diameter at least two times greater than a diameter of the first optical fiber used to collect and transmit light.

10. The optical system as recited in claim 2, wherein the first and second optical fibers are positioned within the body such that a run-out of each of the first and second optical fibers is within +/−25 microns of nominal with a projected distance of 8.6 mm and a pointing error of each of the first and second optical fibers is less than 0.15 degrees, when the fiber optic cable is located within the fiber receiver.

11. A processing system for a workpiece, comprising:
   a processing chamber having a top with a viewport and a base that supports a workpiece during processing; and
   an optical system having a collimator positioned on the viewport to optically monitor the workpiece during processing, comprising:
   a housing;
   an OAP mirror within the housing and having an optical axis, a fold plane and a focal point; and
   a fiber optical cable coupled to the housing, the fiber optical cable comprising first and second optical fibers, each having an exit end that form a common end face of the fiber optic cable, wherein the fiber optical cable is rotationally and translationally aligned to the OAP mirror such that the common face is perpendicular to and centered upon the optical axis of the OAP mirror and positioned a fixed distance from the focal point, and wherein optical axis of the first and second optical fibers are jointly angularly aligned to the fold plane, and the optical axes of the first and second optical fibers deviate from being parallel to the optical axis of the OAP mirror by no more than 0.15 degrees;
   a spectrometer optically connected to the collimator by the first optical fiber; and
   a flashlamp optically connected to the collimator by the second optical fiber.

12. The processing system as recited in claim 11, collimator further comprising a fiber receiver coupled to the housing and having an optical fiber channel extending therethrough and aligning with the optical axis of the OAP mirror, and comprising a body having an alignment notch formed in an outer perimeter thereof, and wherein, the fiber receiver has an alignment key that cooperatively engages with the alignment notch of the body to jointly angularly align the optical axes of the first and second optical fibers to the fold plane of the OAP mirror.

13. The processing system as recited in claim 11, wherein the first and second optical fibers are asymmetric fibers.

14. The processing system as recited in claim 12, wherein the collimator is configured to receive the fiber optical cable and position the common end face of the fiber optical cable approximately 1 mm along the optical axis of the OAP mirror from the focal point of the OAP mirror.

15. The processing system as recited in claim 12, wherein the first and second optical fibers are positioned within the body such that a run-out of each of the first and second optical fibers is within +/−25 microns of nominal with a projected distance of 8.6 mm and a pointing error of each of the first and second optical fibers is less than 0.15 degrees, when the fiber optic cable is located within the fiber receiver.

16. A method of monitoring a semiconductor process comprising:
  positioning a workpiece in optical alignment with optical system having a collimator, comprising;
    a housing;
    an OAP mirror within the housing and having an optical axis, a fold plane and a focal point; and
    a fiber optical cable coupled to the housing, the fiber optical cable comprising first and second optical fibers, each having an exit end and that form a common end face of the fiber optic cable, wherein the fiber optical cable is rotationally and translationally aligned to the OAP mirror such that the common face is perpendicular to and centered upon the optical axis of the OAP mirror and positioned a fixed distance from the focal point, and wherein optical axis of the first and second optical fibers are jointly angularly aligned to the fold plane, and the optical axes of the first and second optical fibers deviate from being parallel to the optical axis of OAP mirror by no more than 0.15 degrees;
  directing light from a light source through a first optical fiber that optically couples the light source to the collimator;
  collecting reflected light from the surface of the workpiece through the second optical fiber; and
  sending the reflected light to an optical detector from the collimator by way of the second optical fiber that optically couples the optical detector to the collimator.

17. The method as recited in claim 16 wherein collimator further comprises a fiber receiver coupled to the housing and having an optical fiber channel extending therethrough and aligning with the optical axis of the OAP mirror, and comprising a body having an alignment notch formed in an outer perimeter thereof, and wherein, the fiber receiver has an alignment key that cooperatively engages with the alignment notch of the body to jointly angularly align the optical axes of the first and second optical fibers to the fold of the OAP mirror.

18. The method as recited in claim 16 wherein the first and second optical fibers are asymmetric fibers.

19. The method as recited in claim 17 wherein the fiber receiver is configured to receive the fiber optical cable and to position the common end face of the fiber optical cable approximately 1 mm along the optical axis of the OAP mirror from the focal point of the OAP mirror.

20. The method as recited in claim 17, wherein the first and second optical fibers are positioned within the body such that a run-out of each of the first and second optical fibers is within +/−25 microns of nominal with a projected distance of 8.6 mm and a pointing error of each of the first and second optical fibers is less than 0.15 degrees, when the fiber optic cable is located within the fiber receiver.

* * * * *